(12) United States Patent
Lin et al.

(10) Patent No.: US 12,408,475 B2
(45) Date of Patent: Sep. 2, 2025

(54) INTERCONNECTED ELECTRODE STRUCTURE HAVING MULTI-CONDUCTIVE THROUGH HOLE AND METHOD OF MANUFACTURING SAME

(71) Applicant: SUZHOU INSTITUTE OF NANO-TECH AND NANO-BIONICS (SINANO), CHINESE ACADEMY OF SCIENCES, Suzhou (CN)

(72) Inventors: Jian Lin, Suzhou (CN); Hao Zhang, Suzhou (CN); Jing Wang, Suzhou (CN); Zhenguo Wang, Suzhou (CN); Qun Luo, Suzhou (CN); Chao Gong, Suzhou (CN); Changqi Ma, Suzhou (CN)

(73) Assignee: SUZHOU INSTITUTE OF NANO-TECH AND NANO-BIONICS (SINANO), CHINESE ACADEMY OF SCIENCES, Suzhou (CN)

( * ) Notice: Subject to any disclaimer, the term of this patent is extended or adjusted under 35 U.S.C. 154(b) by 13 days.

(21) Appl. No.: 18/265,265

(22) PCT Filed: Dec. 27, 2021

(86) PCT No.: PCT/CN2021/141621
§ 371 (c)(1),
(2) Date: Jun. 5, 2023

(87) PCT Pub. No.: WO2022/143519
PCT Pub. Date: Jul. 7, 2022

(65) Prior Publication Data
US 2024/0047589 A1    Feb. 8, 2024

(30) Foreign Application Priority Data

Dec. 28, 2020 (CN) .......................... 202011584404.1

(51) Int. Cl.
| | | |
|---|---|---|
| *H10K 30/83* | (2023.01) | |
| *H10F 71/00* | (2025.01) | |
| *H10F 77/20* | (2025.01) | |

(52) U.S. Cl.
CPC ......... *H10F 77/215* (2025.01); *H10F 71/138* (2025.01); *H10F 77/244* (2025.01)

(58) Field of Classification Search
CPC .... H10F 77/215; H10F 77/244; H10F 77/211; H10F 19/30; H10K 30/83; H10K 29/855
See application file for complete search history.

(56) References Cited

U.S. PATENT DOCUMENTS 9,392,705 B2 * 7/2016 Sunohara ............... H01L 23/147
11,257,749 B2 * 2/2022 Tanaka ............... H01L 23/49838
(Continued)

FOREIGN PATENT DOCUMENTS

| CN | 107808876 A | 3/2018 |
|---|---|---|
| CN | 110021553 A | 7/2019 |

(Continued)

*Primary Examiner* — Ida M Soward
(74) *Attorney, Agent, or Firm* — Bayramoglu Law Offices LLC (57) ABSTRACT

An interconnected electrode structure is provided. The interconnected electrode structure includes an insulating base material, a through hole, a first conductive body, and a second conductive body. The insulating base material includes a first surface and a second surface which face away from each other. The through hole penetrates through the insulating base material in a thickness direction. The first conductive body is formed by conductive slurry that enters the through hole from an opening of the through hole on the first surface. The second conductive body is formed by a second conductive material that enters the through hole from an opening of the through hole on the second surface, and the second conductive body is electrically combined with (Continued)

the first conductive body to form a conductive channel in the insulating base material.

13 Claims, 4 Drawing Sheets

(56) References Cited

U.S. PATENT DOCUMENTS

| | | | | |
|---|---|---|---|---|
| 11,546,990 | B2* | 1/2023 | Tuominen | H05K 3/427 |
| 2009/0139868 | A1* | 6/2009 | Shrader | C25D 1/04 |
| | | | | 205/118 |
| 2011/0120762 | A1* | 5/2011 | Kawai | H05K 3/423 |
| | | | | 205/95 |
| 2017/0358624 | A1* | 12/2017 | Takeya | H10H 20/833 |
| 2019/0281705 | A1* | 9/2019 | Hanya | H05K 3/4061 |
| 2021/0013352 | A1* | 1/2021 | Peng | H10F 77/244 |

FOREIGN PATENT DOCUMENTS

| | | | | |
|---|---|---|---|---|
| CN | 111757593 A | | 10/2020 | |
| EP | 0651602 B1 | | 4/1999 | |
| EP | 2605286 A1 | * | 6/2013 | ..... H01L 31/022441 |
| JP | 2001015913 A | * | 1/2001 | ............... H05K 3/46 |
| JP | 2001177240 A | * | 6/2001 | ............... H05K 3/46 |
| JP | 2004165601 A | | 6/2004 | |
| JP | 2008214679 A | * | 9/2008 | ............... H05K 3/42 |
| JP | 2009049336 A | | 3/2009 | |
| JP | 2010021327 A | * | 1/2010 | ............... H05K 3/42 |
| JP | 2011066312 A | * | 3/2011 | ......... H01L 31/0516 |
| JP | 2011187588 A | | 9/2011 | |
| JP | 2011243928 A | | 12/2011 | |
| JP | 2017117881 A | | 6/2017 | |
| JP | 2018074134 A | | 5/2018 | |
| JP | 2019160885 A | | 9/2019 | |
| TW | 201247053 A | * | 11/2012 | ........... H05K 1/0298 |

* cited by examiner

INTERCONNECTED ELECTRODE STRUCTURE HAVING MULTI-CONDUCTIVE THROUGH HOLE AND METHOD OF MANUFACTURING SAME

CROSS REFERENCE TO THE RELATED APPLICATIONS

This application is the national phase entry of International Application No. PCT/CN2021/141621, filed on Dec. 27, 2021, which is based upon and claims priority to Chinese Patent Application No. 202011584404.1, filed on Dec. 28, 2020, the entire contents of which are incorporated herein by reference.

TECHNICAL FIELD

The present disclosure relates to an electrode, specifically to an interconnected electrode structure, a method of manufacturing same, and a use of same.

BACKGROUND

With the development of new thin film luminescent, photovoltaic, and sensing devices, the application range of high-transparency electrodes also gradually increases. Such an electrode usually requires good optical transparency, conductivity and graphic accuracy. During normal work, this electrode can transmit light at a specified wave band. Therefore, it is one of the important components of a display, a lamp, and a solar battery, and can also be used for special transparent heating films or shielding layers.

Due to the fact that the cost of a transparent conductive material (such as a metal oxide, metal, pedot: pss, and a carbon material) is much greater than that of a transparent insulating material (such as glass, a polymer PET, and transparent polyimide), for a current transparent electrode product, a transparent conductive material with a nanometer thickness is usually deposited on a transparent insulating material with a thickness of 0.03 mm to 0.2 mm. This ensures that the product can satisfy the overall mechanical strength and insulation performance required for production and use. In addition, the transparent insulating material can also serve as a transparent dielectric layer in a capacitive touch-control screen, which further simplifies the production process of the product.

However, there are also some technological incompatibilities in an application process of this kind of transparent electrode product. One of the key bottlenecks is that the aforementioned transparent insulating layer will increase the complexity of device wiring under specific circumstances. For example, when an electrode connection port of an organic light emitting diode (OLED) or a thin-film photovoltaic battery needs to be designed on a rear surface of a device, how to achieve wiring through the insulating layer at the lowest cost becomes a key technological design issue. In addition, since a prepared thin-film device is easy to damage, reserving a conductive line that penetrates through an insulating layer in advance during the manufacturing of a transparent electrode can effectively reduce the overall technological difficulty. But so far, there is no effective solution in the industry. Theoretically, a method for filling a through hole with conductive slurry can be used to achieve the conductive line that penetrates through the insulating layer. However, in actual operations, if the through hole is only filled with a little of conductive liquid, it cannot be ensured that flowing liquid can stably stay in the through hole till the liquid is dried and formed, and instead, the liquid easily flows out from a bottom of the through hole. As a result, a conductive channel is cut off and manufacturing equipment is polluted. Overall immersion can directly contaminate a transparent conductive surface, making it less feasible.

SUMMARY

One objective of the present disclosure is to provide an interconnected electrode structure, to overcome the shortcomings in the prior art.

Another objective of the present disclosure is to provide a method of manufacturing an interconnected electrode structure and a use of an interconnected electrode structure.

In order to achieve the foregoing invention objectives, the technical solutions used by the present disclosure are as follows:

Some embodiments of the present disclosure provide an interconnected electrode structure, including:
- an insulating base material, including a first surface and a second surface which face away from each other;
- a through hole, penetrating through the insulating base material in a thickness direction;
- a first conductive body, formed by conductive slurry that enters the through hole from an opening of the through hole on the first surface, wherein a bottom end of the first conductive body reaches any set position between two ends of the through hole; and
- a second conductive body, formed by a second conductive material that enters the through hole from an opening of the through hole on the second surface, and also electrically combined with the first conductive body to form a conductive channel in the insulating base material.

In some implementations, a second conductive layer is also formed on the second surface of the insulating base material, and the second conductive layer and the second conductive body are integrally formed.

In some implementations, a third conductive layer is also arranged on the second surface of the insulating base material, and the third conductive layer is in electrical contact with the second conductive layer.

In some implementations, the third conductive layer is a transparent conductive layer.

In some implementations, the second conductive layer is distributed at least on one side of the third conductive layer.

In some implementations, the second conductive layer is arranged around the third conductive layer in a semi-enclosed form, or the second conductive layer is arranged around the third conductive layer.

In some implementations, the second conductive layer and the third conductive layer at least partially overlap.

In some implementations, the second conductive layer is linear and has a line width less than or equal to 5 mm.

In some implementations, an equivalent square resistance of the second conductive layer is less than or equal to 5 Ω/sq.

In some implementations, a thickness of the second conductive layer is greater than a protrusion height of an edge portion of an opening of the through hole on the second surface of the insulating base material relative to the second surface.

In some implementations, the second conductive layer covers the opening of the through hole on the second surface of the insulating base material and extends radially outward from the edge portion of the opening by 20 µm or more In some implementations, a protrusion height of the highest point of the second conductive layer relative to the third conductive layer is less than 5 µm.

In some implementations, an area of the opening of the through hole on the first surface or the second surface of the insulating base material is smaller than 0.13 mm².

In some implementations, a perimeter of the opening of the through hole on the first surface or the second surface of the insulating base material is 10-800 µm.

In some implementations, a protrusion height of an edge portion of the opening of the through hole on the first surface or the second surface of the insulating base material relative to the first surface or the second surface is less than 5 µm.

In some implementations, a conductive structure formed by conductive slurry is arranged on the first surface of the transparent insulating base material, and the conductive structure and the first conductive body are integrally formed.

In some implementations, the insulating base material includes a transparent insulating film.

In some implementations, a thickness of the insulating base material is 1-300 µm.

Some embodiments of the present disclosure provide a method of manufacturing an interconnected electrode structure, including:
  machining a selected region of an insulating base material to form a through hole, wherein the through hole penetrates through the insulating base material in a thickness direction;
  applying a conductive slurry containing a first conductive material to a first surface of the insulating base material, and allowing part of the conductive slurry to enter the through hole and reach a set position, wherein the selected position is located between two ends of the through hole; and
  forming, from a second conductive material, a second conductive layer on a second surface of the insulating base material facing away from the first surface, and allowing part of the second conductive material to enter the through hole to form a second conductive body, wherein the second conductive body is electrically combined with a first conductive body in the through hole, and the first conductive body is formed by the conductive slurry entering the through hole, so that a conductive channel is formed in the insulating base material.

In some implementations, the method further includes: forming a third conductive layer on a second surface of the insulating base material, wherein the third conductive layer is a transparent conductive layer, and is in electrical contact with the second conductive layer.

Some embodiments of the present disclosure also provide an interconnected electrode structure formed by any of the aforementioned methods.

Some embodiments of the present disclosure also provide a use of the interconnected electrode structure.

Compared with the prior art, the beneficial effects of the technical solutions provided by the embodiments of the present disclosure at least lie in:

(1) The provided method of manufacturing the interconnected electrode structure is simple and easy to operate, which effectively simplifies the wiring design and manufacturing technology of conducting the front and rear surfaces of a transparent electrode, and can significantly reduce the cost and avoid the problems of high technological difficulty, low yield and the like caused by a mode of "manufacturing devices first and then penetrating through the insulating layer".

(2) The manufactured interconnected electrode structure is simple, has good electrical conductivity and high yield, and has a wide application prospect in OLEDs, photovoltaic batteries, photoelectric detectors, and other photoelectric devices.

DETAILED DESCRIPTION OF THE EMBODIMENTS

The technical solutions of the present disclosure will be described in more detail in conjunction with specific implementations. It should be noted that unless otherwise specifically stated, the use of the terms "include, includes, including" and "have, has or having" in this specification should generally be understood as open and unrestricted. Moreover, it should be understood that the order of steps or the order in which specific actions are performed is not very important, as long as the instructions in the present disclosure remain operable. In addition, two or more steps or actions can be performed simultaneously.

A method of manufacturing an interconnected electrode structure provided by some embodiments of the present disclosure includes:
  machining a selected region of an insulating base material to form a through hole, wherein the through hole penetrates through the insulating base material in a thickness direction;
  applying a conductive slurry containing a first conductive material to a first surface of the insulating base material, and allowing part of the conductive slurry to enter the through hole and reach a set position, wherein the selected position is located between two ends of the through hole; and
  forming, from a second conductive material, a second conductive layer on a second surface of the insulating base material facing away from the first surface, and allowing part of the second conductive material to enter the through hole to form a second conductive body, wherein the second conductive body is electrically combined with a first conductive body in the through hole, and the first conductive body is formed by the conductive slurry entering the through hole, so that a conductive channel is formed in the insulating base material.

In the above embodiment of the present disclosure, one or more through holes are formed in the insulating base material, and a viscosity and other properties of the conductive slurry are adjusted, so that the conductive slurry can enter the through hole without leaking out of the through hole under the action of gravity (or other external forces) after being applied to the first surface of the insulating base material. On the one hand, a conductive body can be formed in the subsequent process, and cooperates with the second conductive material entering the through hole to form a conductive channel penetrating through the insulating base material. On the other hand, the problem can also be avoided that the conductive slurry is exposed from the through hole and contaminates the second surface of the insulating base material. The technology is simple, highly controllable and low in cost, and is conducive to improving the device yield and ensuring the device performance.

Further, a manner of forming the through hole in the insulating base material can be existing, such as machining, laser ablation, or other physical and chemical manners. If the machining or laser ablation manner is used, in most cases, an annular bulge may be possibly formed at an edge of the machined through hole.

Further, the shape and size of the through hole may be randomly selected according to an actual requirement. For example, the through hole may be circular, polygonal or in other irregular shapes.

In some implementations, an area of an opening of the through hole on the first surface or the second surface of the insulating base material is smaller than 0.13 mm$^2$, preferably smaller than 0.03 mm$^2$.

In some implementations, a perimeter of the opening of the through hole on the first surface or the second surface of the insulating base material is 10-800 μm, preferably 60-400 μm.

In some implementations, a protrusion height of an edge portion of the opening of the through hole on the first surface or the second surface of the insulating base material relative to the first surface or the second surface is less than 5 μm, preferably less than 1 μm.

In some implementations, the method further includes: forming a third conductive layer on the second surface of the insulating base material, wherein the third conductive layer is a transparent conductive layer.

Further, in some more specific implementations, the method includes: first forming the conductive channel in the insulating base material, then forming a third conductive layer on the second surface of the insulating base material, and allowing the third conductive layer to be in electrical contact with the second conductive layer.

Further, in some more specific implementations, the method includes: first forming a third conductive layer on the second surface of the insulating base material, then machining a selected region of the insulating base material to form a through hole, forming the conductive channel in the insulating base material, and allowing the second conductive layer to be in electrical contact with the third conductive layer.

Further, in some more specific implementations, the method includes: depositing a conductive layer around the opening of the through hole on one side (namely, the second surface of the insulating base material) of the transparent conductive layer after part of the conductive slurry enters the through hole and reaches a selected position and after the deposition of the transparent conductive layer is completed.

In these implementations, setting the second conductive layer not only improves a contact effect between the transparent conductive layer and the conductive slurry used to form the conductive channel, but also helps to improve the electrical conductivity of the transparent conductive layer.

In these implementations, the conductive slurry is printed, coated or dispensed on a perforated region of the first surface of the insulating base material, so that the conductive slurry spontaneously enters the through hole due to the gravity and the like. However, due to the effects of a surface tension and a viscosity, as well as the timely volatilization of the solvent, the fluidity is rapidly reduced, thereby ensuring that the conductive slurry will not flow out of a lower surface (namely, the second surface of the insulating base material) of the through hole due to the gravity.

Further, a material of the transparent conductive layer includes any one or a combination of more of a metal oxide (such as ITO, AZO and FTO), metal (such as a metal grid and a metal nanowire network), a conductive polymer, and a carbon material, and is not limited thereto.

In some implementations, the insulating base material includes a transparent insulating film. For example, a material of the transparent insulating film includes any one or a combination of more of glass, polyester (PET), polyurethane (PU), and polyimide (PI), and is not limited thereto.

In some implementations, a thickness of the insulating base material is 1-300 μm, preferably 15-150 μm.

In some implementations, there is one or more through holes.

In some implementations, the through hole penetrates through the insulating base material vertically in the thickness direction.

In some implementations, the conductive slurry generally refers to a conductive material that has fluidity and can be turned into a solid under a certain condition, and the turning condition can be heating, natural drying, light irradiation, or the like. Further, the conductive slurry includes, but is not limited to, silver paste, for example, may also be various types of conductive ink known in the art. When the conductive slurry is under a certain condition (such as heating, natural drying or light irradiation), some volatile constituents (such as a solvent and a diluent) in the conductive slurry will be volatilized and removed, or undergo quick cross-linking reaction due to the light irradiation, so that the conductive slurry is turned into a conductive solid. Or, some constituents in the conductive slurry may possibly react with a substance in an environment or other constituents in the conductive slurry, so that the conductive slurry is turned into a conductive solid. In some cases, the conductive slurry can also use a conductive adhesive or a conductive adhesive diluted with a solvent or an active diluent.

In some implementations, the viscosity of the conductive slurry is 20-100,000 cP, preferably 100-10,000 cP.

In some implementations, a surface tension of a main solvent constituent in the conductive slurry is 15-72 dyn/cm, preferably 27-50 dyn/cm.

It can also be considered that the surface tension of the conductive slurry is preferably 15-72 dyn/cm, particularly preferably 27-50 dyn/cm.

In some implementations, a manner of applying the conductive slurry to the first surface of the insulating base material includes any one of or a combination of more of printing, coating or adhesive dispensing, but is not limited to this.

In some implementations, a manner of forming the second conductive layer on the second surface of the insulating base material using the second conductive material includes a physical and/or chemical deposition manner, preferably including any one or a combination of more of printing, coating, adhesive dispensing, vacuum evaporation, or magnetron sputtering, and is not limited to this.

In some implementations, the method specifically includes: forming the second conductive layer by using any one of inkjet printing, air jet printing, intaglio printing, screen printing, flexographic printing, and mask spraying.

In some implementations, a thickness of the second conductive layer is greater than a protrusion height of an edge portion of an opening of the through hole on the second surface of the insulating base material relative to the second surface.

In some implementations, the second conductive layer covers the opening of the through hole on the second surface of the insulating base material and extends radially outward from the edge portion of the opening by 20 μm or more, preferably 50 μm or more.

Further, no special restriction is made on the shape of the second conductive layer, and can be randomly adjusted according to actual needs.

Further, a material of the second conductive layer includes all kinds of highly conductive metal or non-metal materials such as Au, Ag and Cu.

In some implementations, the second conductive layer is distributed at least on one side of the third conductive layer.

Further, the second conductive layer is arranged around the third conductive layer in a semi-enclosed form.

Further, the second conductive layer is arranged around the third conductive layer.

In some implementations, the second conductive layer is linear and has a line width less than or equal to 5 mm, preferably less than or equal to 1 mm.

In some implementations, a protrusion height of the highest point of the second conductive layer relative to the third conductive layer is less than 5 μm, preferably less than 1 μm.

In some implementations, the second conductive layer and the third conductive layer at least partially overlap. For example, the through hole can be made to continuously penetrate through the insulating base material and the third conductive layer preset on the second surface of the insulating base material, and the second conductive layer is made to at least partially overlap the third conductive layer. Or, the second conductive layer may be first formed on the second surface of the insulating base material, and then the third conductive layer may be formed on the second surface of the insulating base material; and the third conductive layer is made to at least partially overlap the second conductive layer.

In some implementations, an equivalent square resistance of the second conductive layer is less than or equal to 5 Ω/sq, preferably less than or equal to 1 Ω/sq.

As known to those skilled in the art, whether it is a truly transparent conductive material (such as metal oxide, pedot: pss and graphene), or a solution that relies on interstitial light transmission such as a metal grid and a nanowire network, its working principle determines that: an actual overall resistance of the same product will significantly increase even though a square resistance per area will remain consistent under the same optical transmittance. A voltage drop effect caused by the resistance of the transparent electrode itself is also more obvious. Therefore, while other parameters remain unchanged, increasing the sizes of products such as a smart curtain wall, a display, and a solar battery means that the resistance of the transparent electrode increases, leading to a decline in performance. Therefore, how to reduce the total resistance of the transparent electrode as low as possible and effectively, while ensuring sufficient optical transmittance, is one of the challenges that the field is eager to address.

In the above implementations of the present disclosure, the second conductive layer with lower resistance is arranged at a periphery of the transparent conductive layer and serves as a conductive channel, so that due to the specific "short-circuit effect" of a circuit, a low-cost and high-performance "highway" can be provided for a large-area transparent electrode without changing the electrical conductivity of the transparent electrode itself, thus effectively improving the overall performance of a product. Furthermore, the technological flow is simple, the cost is low, and the application range is wide, which is conductive to the subsequence solar battery module assembling technology.

Some embodiments of the present disclosure also provide an interconnected electrode structure formed by any of the aforementioned methods.

Further, the interconnected electrode structure includes a conductive channel formed within a transparent insulating base material. The conductive channel includes a through hole penetrating through the transparent insulating base material in a thickness direction, a first conductive body formed by conductive slurry that enters the through hole from an opening of the through hole on a first surface of the transparent insulating base material, and a second conductive body formed by a conductive material that enters the through hole from an opening of the through hole on the second surface of the transparent insulating base material. The first conductive body is electrically combined with the second conductive body. A third conductive layer and a second conductive layer formed by a conductive material are also arranged on a second surface of the transparent insulating base material. The second conductive layer and the second conductive body are integrally formed, and the third conductive layer is in electrical contact with the second conductive layer.

Further, the third conductive layer is a transparent conductive layer.

Further, a conductive structure formed by conductive slurry is also arranged on the first surface of the transparent insulating base material, and the conductive structure and the first conductive body are integrally formed.

Some embodiments of the present disclosure also provide a use of the interconnected electrode structure, such as in the manufacturing of various photoelectric devices.

Further, some embodiments of the present disclosure provide a device that includes a functional module and an electrode module that cooperates with the functional module, and the electrode module includes the interconnected electrode structure. The device may be an electronic or mechanical device including photoelectric elements, light emitting elements, electronic elements, and the like. The functional module can include, but is not limited to, an LED, an OLED, a thin-film photovoltaic battery, a laser, and the like.

The technical solutions of the present disclosure are described in more detail below in combination with several embodiments and accompanying drawings. It should be pointed that unless otherwise stated, all raw materials, chemical agents, equipment and the like used in the following embodiments can be purchased on the market. The operations such as printing, spraying, spin-coating and magnetron sputtering can be implemented according to the methods known in the art.

Figure 1A:
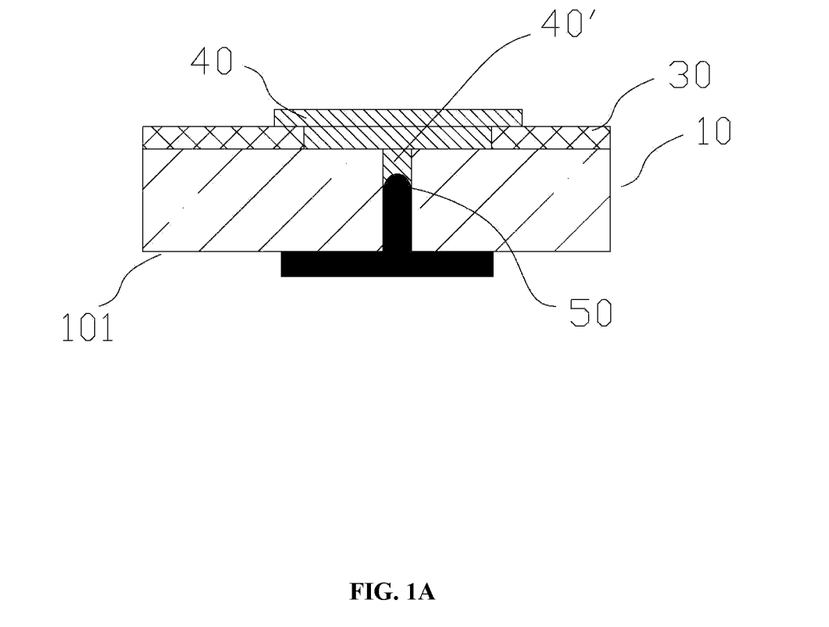
FIG. 1A is a schematic diagram of an interconnected electrode structure in Embodiment 1 of the present disclosure.

Embodiment 1: An interconnected electrode structure provided in this embodiment is shown in FIG. 1A, which includes a polyimide (PI) film 10 and a through hole 103 penetrating through the PI film 10 in a thickness direction. A first conductive body 20' and a second conductive body 40' are distributed in the through hole 103, and the first conductive body 20' and the second conductive body 40' are electrically combined to form a conductive channel in the PI film 10. The first conductive body 20' is formed by solidification of conductive silver paste 20 that enters the through hole 103 from an opening of the through hole 103 located on a front surface (a first surface 101) of the PI film. A bottom end of the first conductive body 20' is located at a position between two ends of the through hole 103. The second conductive body 40' is formed by Au that enters the through hole 103 from an opening of the through hole 103 located on a back surface (a second surface 102) of the PI film. At the same time, part of the conductive silver paste 20 can also remain on the front surface of the PI film to form a first conductive layer, and an Au layer serving as a second conductive layer can also be arranged on the back surface of the PI film. The Au layer can be integrally formed with the second conductive body 40'. In addition, a transparent conductive layer 30 serving as a third conductive layer can also be arranged on the back surface of the PI film, and the transparent conductive layer 30 is in electrical contact with the Au layer.

Figure 1B:
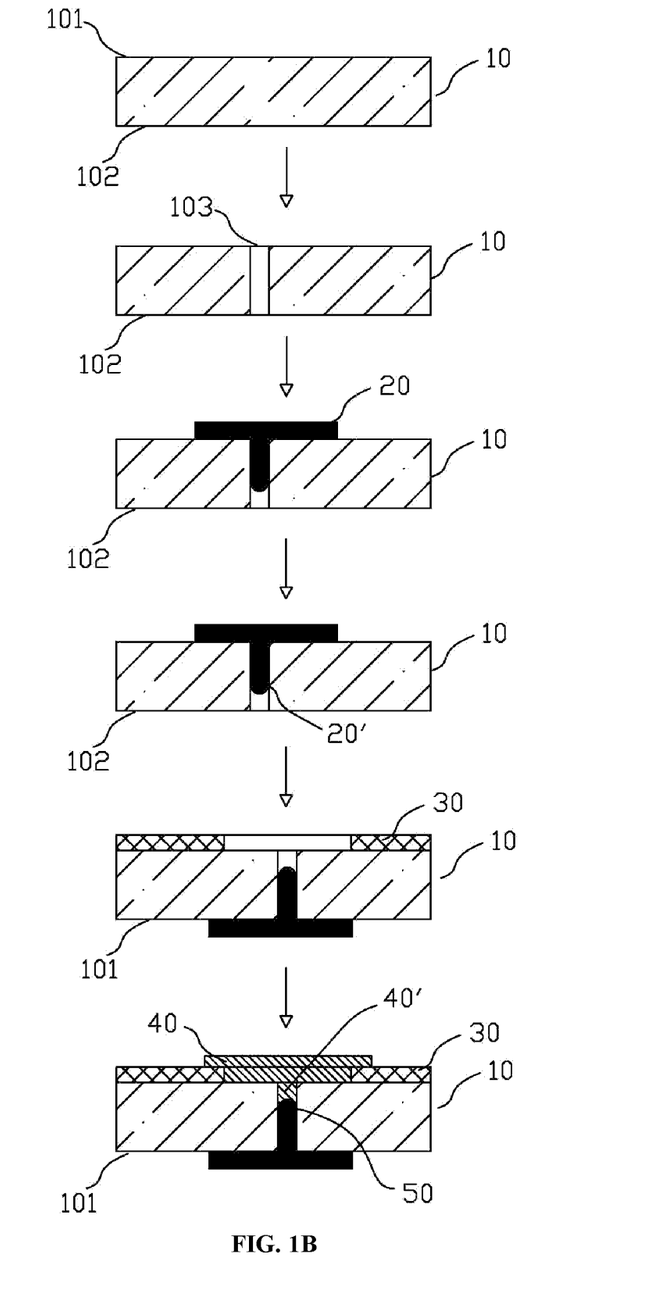
FIG. 1B is a schematic diagram of a manufacturing technology of an interconnected electrode structure in Embodiment 1 of the present disclosure.

A method of manufacturing the interconnected electrode structure is as shown in FIG. 1B, including the following steps:

(1) A PI film 10 with a thickness of about 300 μm is machined to form a plurality of through holes 103. Each through hole perpendicularly penetrates through the PI film and is circular, polygonal or of other irregular shapes. A perimeter of a single through hole may be ranged from about 10 μm to 50 μm, and an area of an opening of the through hole on a front surface (the first surface 101) of the PI film or an area of an opening of the through hole on a back surface (the second surface 102) is smaller than 0.03 mm$^2$; and protrusion heights of edges of the openings of the various through holes on the front and back surfaces of the PI film are all less than 1 μm.

(2) Conductive silver paste 20 (a surface tension of a main solvent constituent is 35-72 dyn/cm) with a viscosity of 20-80 cP is applied to a region, on which the through holes are distributed, on the front surface of the PI film 10, so that part of the conductive silver paste enters the various through holes by itself under the action of gravity, and will automatically stop at a certain distance from the back surface of the PI film. The conductive silver paste is then solidified. The conductive silver paste in the various through holes form a first conductive body 20'.

(3) A transparent conductive layer 30 formed by a metal nanowire (such as silver nanowire) film is manufactured in a remaining region on the back surface of the PI film except for the region where the through holes are located.

(4) An Au layer 40 is deposited by magnetron sputtering in the region, on which the through holes are distributed, on the back surface of the PI film. The Au layer 40 is in electrical contact with the transparent conductive layer 30. A thickness of the Au layer is greater than the protrusion heights of the edges of the openings of the various through holes on the back surface of the PI film. The Au layer deposition region covers and extends beyond the edges of the openings of the various through holes on the back surface of the PI film by 20 μm or more, and there is no shape restriction. Part of the Au layer also enters the various through holes to form a second conductive body 40' which is electrically combined with the first conductive body to form a conductive channel 50 that penetrates through the PI film, thereby obtaining an interconnected electrode structure. It can also be considered to obtain a transparent electrode with a through circuit.

All kinds of photoelectric devices can be manufactured on the basis of the transparent electrode. For example, an organic light emitting device (OLED) can be fabricated on the surface of the PI film provided with the metal nanowire film. Because this device can arrange wires on the other surface of the PI film through the conductive channel, in practical applications, it means that there are more options for OLED circuit assembling, and it is even possible to achieve a narrower border suitable for applications to products including, but not limited to, bendable screen electrodes and the like.

Figure 2:
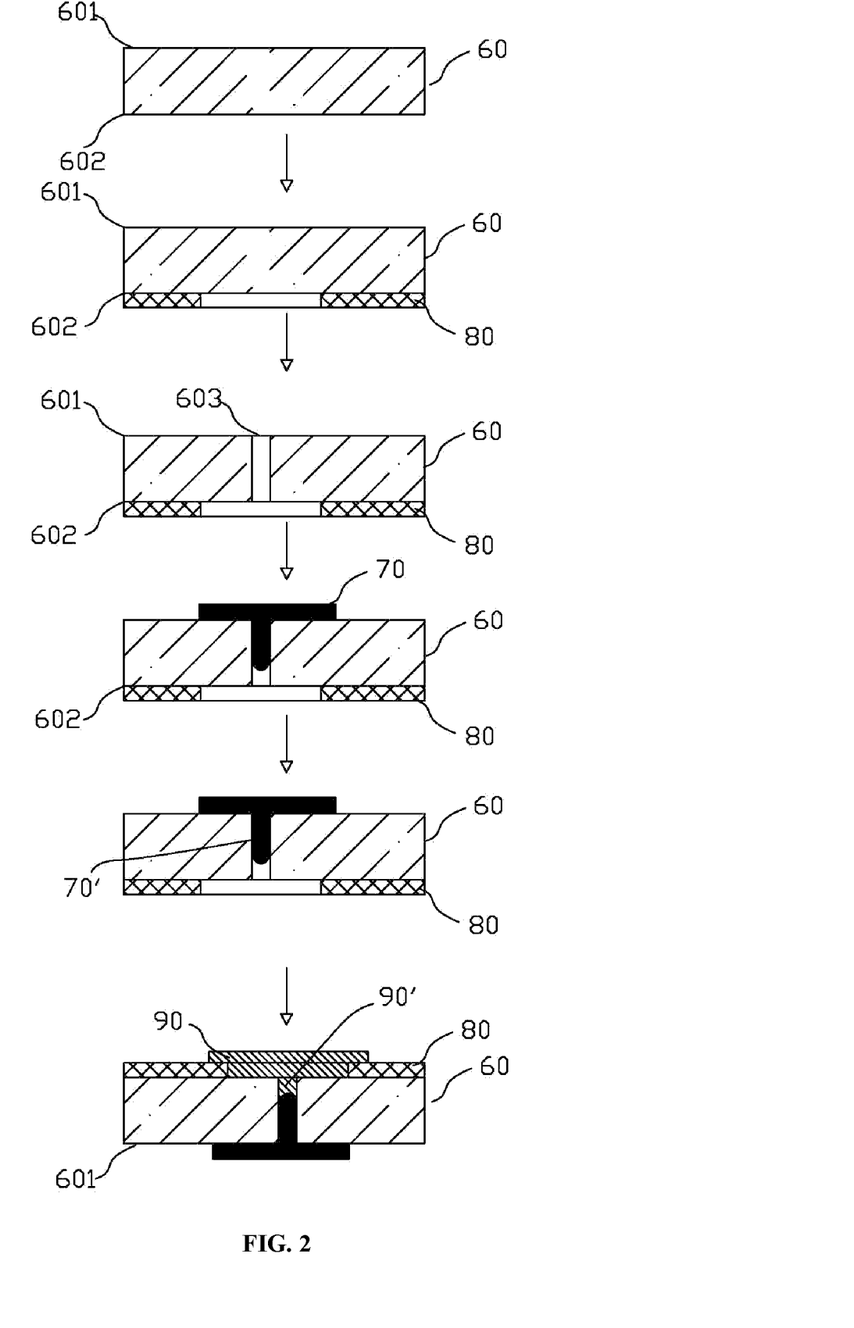
FIG. 2 is a schematic diagram of a manufacturing technology of an interconnected electrode structure in Embodiment 2 of the present disclosure.

Embodiment 2: A method of manufacturing an interconnected electrode structure, as shown in FIG. 2, includes the following steps:

(1) An indium tin oxide (ITO) transparent conductive layer 80 is formed on a back surface of a PE film 60 with a thickness of about 150 μm.

(2) The PE film is machined to form a plurality of through holes 603, wherein each through hole perpendicularly penetrates through the PE film and is circular, polygonal or of other irregular shapes. A perimeter of a single through hole may be ranged from about 500 μm to 800 μm, and an area of an opening of the through hole on a front surface (the first surface 601) of the PE film or an area of an opening of the through hole on a back surface (the second surface 602) is smaller than 0.13 mm$^2$; and protrusion heights of edges of the openings of the various through holes on the front and back surfaces of the PE film are all less than 5 μm.

(3) Conductive silver paste 70 (a surface tension of a main solvent constituent is 15-40 dyn/cm) with a viscosity of 80000-100000 cP is applied to a region, on which the through holes are distributed, on the front surface of the PE film, so that part of the conductive silver paste enters the various through holes by itself under the action of gravity, and will automatically stop at a certain distance from the back surface of the PE film; the conductive silver paste is dried into a solid because of solvent volatilization, to form a first conductive body 70'.

(4) An Ag layer 90 is deposited by magnetron sputtering in the region, on which the through holes are distributed, on the back surface of the PE film. The Au layer 90 is in electrical contact with the ITO transparent conductive layer 80. A thickness of the Ag layer is greater than the protrusion heights of the edges of the openings of the various through holes on the back surface of the PE film. The Ag layer deposition region covers and extends beyond the edges of the openings of the various through holes on the back surface of the PE film by 50 μm or more, and there is no shape restriction. Part of the Ag layer also enters the various through holes to form a second conductive body 90' which is electrically combined with the first conductive body to form a conductive channel that penetrates through the PE film, thereby obtaining an interconnected electrode structure. It can also be considered to obtain a transparent electrode with a through circuit.

All kinds of photoelectric devices can be manufactured on the basis of the transparent electrode. For example, the surface of the film provided with the ITO layer can serve as an electrode of a thin-film solar battery. Because the electrode can be connected to an external circuit on the other surface of the PET film through the conductive interconnected electrode structure, more significant convenience is achieved in application.

Embodiment 3: A method of manufacturing an interconnected electrode structure includes the following steps:

(1) A PU film with a thickness of about 100-120 μm is machined to form a plurality of through holes. Each through hole perpendicularly penetrates through the PU film and is circular, polygonal or of other irregular shapes. A perimeter of a single through hole may be ranged from about 60 μm to 100 μm, and an area of an opening of the through hole on a front surface (the first surface) of the PU film or an area of an opening of the through hole on a back surface (the second surface) is smaller than 0.03 mm$^2$; and protrusion heights of edges of the openings of the various through holes on the front and back surfaces of the PU film are all less than 1 μm.

(2) Conductive silver paste (a surface tension of a main solvent constituent is 25-60 dyn/cm) with a viscosity of 100-300 cP is applied to a region, on which the through holes are distributed, on the front surface of the PU film, so that part of the conductive silver paste enters the various through holes by itself under the action of gravity, and will automatically stop at a certain distance from the back surface of the PU film. The conductive silver paste is then solidified. The conductive silver paste in the various through holes form a first conductive body.

(3) A transparent conductive layer formed by a carbon nanowire tube film is manufactured in a remaining region on the back surface of the PU film except for the region where the through holes are located.

(4) A Cu layer is deposited by magnetron sputtering in the region, on which the through holes are distributed, on the back surface of the PU film. The Cu layer is in electrical contact with the transparent conductive layer. A thickness of the Cu layer is greater than the protrusion heights of the edges of the openings of the various through holes on the back surface of the PU film. The Cu layer deposition region covers and extends beyond the edges of the openings of the various through holes on the back surface of the PU film by 20 μm or more, and there is no shape restriction. Part of the Cu layer also enters the various through holes to form a second conductive body which is electrically combined with the first conductive body to form a conductive channel that penetrates through the PU film, thereby obtaining an interconnected electrode structure. It can also be considered to obtain a light-transmittance electrode with a through circuit.

All kinds of photoelectric devices can be manufactured on the basis of the transparent electrode. For example, a display screen can be manufactured on the surface of the PU film provided with the carbon nanotube tube film by first etching a circuit and then binding a Mini LED chip. When a voltage can be applied to the back surface of the Cu layer through the reserved through circuit, a borderless display circuit can be realized under a specific condition.

Embodiment 4: A method of manufacturing an interconnected electrode structure includes the following steps:

(1) Glass with a thickness of about 130-150 μm is machined to form a plurality of through holes. Each through hole perpendicularly penetrates through the glass and is circular, polygonal or of other irregular shapes. A perimeter of a single through hole may be ranged from about 300 μm to 400 μm, and an area of an opening of the through hole on a front surface (the first surface) of the PE film or an area of an opening of the through hole on a back surface (the second surface) is smaller than 0.03 mm$^2$; and protrusion heights of edges of the openings of the various through holes on the front and back surfaces of the glass are all less than 1 μm.

(2) Conductive silver paste (a surface tension of a main solvent constituent is 30-60 dyn/cm) with a viscosity of 800-1000 cP is applied to a region, on which the through holes are distributed, on the front surface of the glass, so that part of the conductive silver paste enters the various through holes by itself under the action of gravity, and will automatically stop at a certain distance from the back surface of the glass. The conductive silver paste is then solidified. The conductive silver paste in the various through holes form a first conductive body.

(3) A transparent conductive layer formed by pedot: pss is manufactured in a remaining region on the back surface of the glass except for the region where the through holes are located.

(4) A Cu layer is deposited by magnetron sputtering in the region, on which the through holes are distributed, on the back surface of the glass. The Cu layer is in electrical contact with the transparent conductive layer. A thickness of the Cu layer is greater than the protrusion heights of the edges of the openings of the various through holes on the back surface of the glass. The Cu layer deposition region covers and extends beyond the edges of the openings of the various through holes on the back surface of the glass by 50 μm or more, and there is no shape restriction. Part of the Cu layer also enters the various through holes to form a second conductive body which is electrically combined with the first conductive body to form a conductive channel that penetrates through the glass, thereby obtaining an interconnected electrode structure. It can also be considered to obtain a transparent electrode with a through circuit.

All kinds of photoelectric devices can be manufactured on the basis of the transparent electrode. A main body structure of an OLED can be arranged on the surface of the glass provided with the transparent conductive layer.

Embodiment 5: A method of manufacturing an interconnected electrode structure includes the following steps:

(1) A PU film with a thickness of about 140-150 μm is machined to form a plurality of through holes. Each through hole perpendicularly penetrates through the PU film and is circular, polygonal or of other irregular shapes. A perimeter of a single through hole may be ranged from about 200 μm to 250 μm, and an area of an opening of the through hole on a front surface (the first surface) of the PU film or an area of an opening of the through hole on a back surface (the second surface) is smaller than 0.03 mm$^2$; and protrusion heights of edges of the openings of the various through holes on the front and back surfaces of the PU film are all less than 1 μm.

(2) Conductive silver paste (a surface tension of a main solvent constituent is 27-65 dyn/cm) with a viscosity of 400-500 cP is applied to a region, on which the through holes are distributed, on the front surface of the PU film, so that part of the conductive silver paste enters the various through holes by itself under the action of gravity, and will automatically stop at a certain distance from the back surface of the PU film. The conductive silver paste is then solidified. The conductive silver paste in the various through holes form a first conductive body.

(3) A transparent conductive layer formed by a graphene film is manufactured in a remaining region on the back surface of the PU film except for the region where the through holes are located.

(4) A Cu layer is deposited by magnetron sputtering in the region, on which the through holes are distributed, on the back surface of the PU film. The Cu layer is in electrical contact with the transparent conductive layer. A thickness of the Cu layer is greater than the protrusion heights of the edges of the openings of the various through holes on the back surface of the PU film. The Cu layer deposition region covers and extends beyond the edges of the openings of the various through holes on the back surface of the PU film by 50 μm or more, and there is no shape restriction. Part of the Cu layer also enters the various through holes to form a second conductive body which is electrically combined with the first conductive body to form a conductive channel that penetrates through the PU film, thereby obtaining an interconnected electrode structure. It can also be considered to obtain a transparent electrode with a through circuit.

All kinds of photoelectric devices can be manufactured on the basis of the transparent electrode. A main body structure of an ultraviolet ray detector can be arranged on the surface of the PU film provided with the transparent conductive layer.

Embodiment 6: A method of manufacturing a thin-film solar battery includes the following steps:

(1) This step is basically the same as that in Embodiment 2.

(2) This step is basically the same as that in Embodiment 2.

(3) This step is basically the same as that in Embodiment 2.

Figure 3:
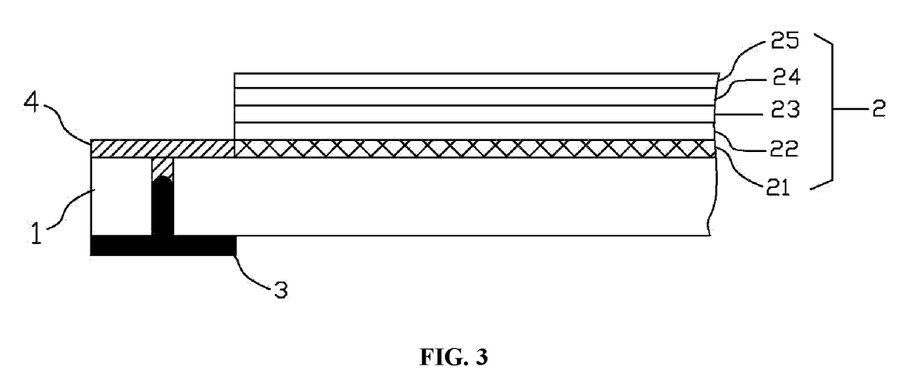
FIG. 3 is a cross-sectional diagram of a thin-film solar battery in Embodiment 6 of the present disclosure.
Figure 4:
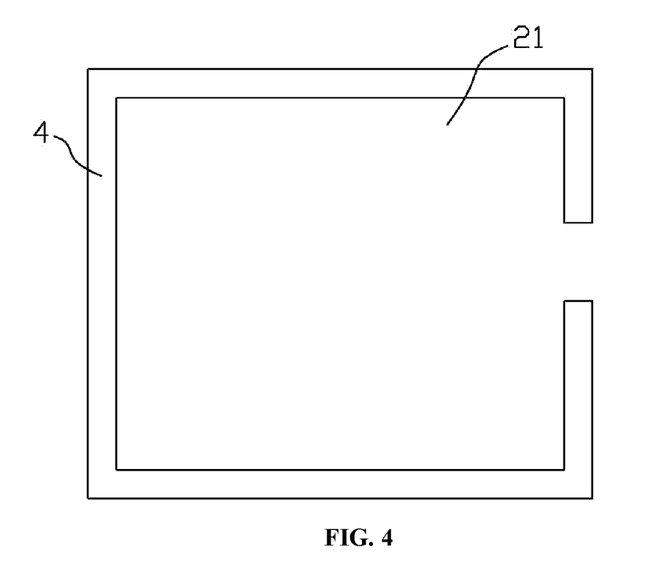
FIG. 4 is a bottom view of a thin-film solar battery in Embodiment 6 of the present disclosure.

(4) This step is basically the same as that in Embodiment 2, but referring to FIG. 3 and FIG. 4. The formed Ag layer 4 is arranged around the transparent conductive layer 21 and is in electrical contact with the transparent conductive layer 21.

(5) An electron transfer layer 22 (such as a zinc oxide film layer with a thickness of about 50 nm), an active layer 23 (such as a PM6:Y6 active layer with a thickness of about 100 nm), a hole transfer layer 24 (such as a MoO3 film with a thickness of about 10 nm) and a metal top electrode 25 (such as metal Al with a thickness of about 100 nm) are manufactured in sequence on the transparent conductive layer 21 according to a method known in the art, thus forming a thin-film solar battery 2 (which is defined as the product of the present disclosure) on the PE film 1.

The thin-film solar battery 2 can be used as a basic structural unit of a battery module, and can be easily connected to other cells through silver paste 3. Moreover, the aforementioned Ag layer can effectively improve the overall performance of the product without changing the electrical conductivity of the transparent electrode itself. The solution shown in FIG. 4 is particularly suitable for being used in devices with transparent electrodes with a larger size (which is greater than or equal to 10 mm, preferably greater than or equal to 50 mm). The Ag layer 4 can be set as a conductive line, with a width of less than or equal to 5 mm, preferably less than or equal to 1 mm, and an equivalent square resistance of the line is less than or equal to 5 Ω/sq, preferably less than or equal to 1 Ω/sq. In addition, compared with the transparent conductive electrode, a protrusion height of the highest point of the Ag layer 4 is less than 5 μm, preferably less than 1 μm. In addition, the Ag layer 4 can also be formed using other methods known in the art, such as inkjet printing, air jet printing, intaglio printing, screen printing, flexographic printing, MASK spraying, and the like.

As a contrast, step (5) above can be referred to, but an ITO transparent conductive layer, an electron transport layer, an active layer, a hole transfer layer, and a metal top electrode are sequentially formed on a PE film with a thickness of about 150 μm, thereby forming a thin-film solar battery (defined as a contrast product) on the PE film.

When the product of the present disclosure is compared with the contrast product, it can be found that the most prominent advantage of the product of the present disclosure lies in the convenience of later assembling. The circuit can be directly connected to the back surface of the battery, without considering hole passing and wiring to connect the electrode on the front surface of the battery. In addition, due to the presence of the second conductive body, an actual equivalent square resistance of the transparent electrode is significantly reduced, which typically improves the efficiency of the solar battery by more than 5%.

It can be considered that the above embodiments of the present disclosure actually provide a method of manufacturing a transparent electrode reserved with a through circuit, in which, the surface tension, the viscosity, the solvent volatility and other characteristics of the conductive slurry such as the silver paste itself are fully used to design a reasonable process window. Specifically, a flowing resistance inside the fluid like conductive material (the conductive slurry) and an interaction force between the conductive material and a wall of the through hole is fully used to offset the gravitational action of the conductive material itself, achieving a delicate balance, to ensure that the above conductive material can stay at a designated position in the middle of the through hole, and achieve expected process objectives. This method has the advantages of simple process, low manufacturing cost and the like. The transparent electrode obtained has good electrical conductivity and high yield, which can effectively avoid the problems of high technological difficulty, low yield and the like caused by the mode of "manufacturing devices first and then penetrating through the insulating layer".

The various aspects, embodiments, features, and examples of the present disclosure shall be considered to be illustrative in all respects and are not intended to limit the present disclosure. The scope of the present disclosure is only defined by the claims. Without departing from the spirit and scope of the claimed application, those skilled in the art will be aware of other embodiments, modifications, and uses.

The use of titles and chapters in the present disclosure does not mean limiting the present disclosure. Each chapter can be applied to any aspect, embodiment, or feature of the present disclosure. Although the present disclosure has been described with reference to the illustrative embodiments, those skilled in the art will understand that various other changes, omissions, and/or additions can be made without departing from the spirit and scope of the present disclosure and that substantial equivalents can be used to replace the elements of the embodiments.

In addition, many modifications can be made to enable specific situations or materials to adapt to the teachings of the present disclosure without departing from the scope of the present disclosure. Therefore, it is not intended herein to limit the present disclosure to the disclosed specific embodiments used to execute the present disclosure, but intended to make the present disclosure include all the embodiments within the scope of the appended claims. In addition, unless specifically stated, any use of the terms first, second and the like does not indicate any order or importance, but the terms first, second and the like are used to distinguish one element from another.

What is claimed is:

1. An interconnected electrode structure, comprising:
an insulating base material, comprising a first surface and a second surface which face away from each other;
a through hole, penetrating through the insulating base material in a thickness direction;
a first conductive body, formed by conductive slurry that enters the through hole from an opening of the through hole on the first surface, wherein a bottom end of the first conductive body reaches any set position between two ends of the through hole; and
a second conductive body, formed by a second conductive material that enters the through hole from an opening of the through hole on the second surface, and also electrically combined with the first conductive body to form a conductive channel in the insulating base material, wherein a second conductive layer is formed on the second surface of the insulating base material, and the second conductive layer and the second conductive body are integrally formed, wherein a third conductive layer is arranged on the second surface of the insulating base material, and the third conductive layer is in electrical contact with the second conductive layer, wherein the third conductive layer is a transparent conductive layer, wherein the second conductive layer is arranged around the third conductive layer in a semi-enclosed form, the second conductive layer is arranged around the third conductive layer; the second conductive layer and the third conductive layer at least partially overlap, the second conductive layer is linear and has a line width less than or equal to 5 mm, an equivalent square resistance of the second conductive layer is less than or equal to 5 Ω/sq, a thickness of the second conductive layer is greater than a protrusion height of an edge portion of the opening of the through hole on the second surface of the insulating base material relative to the second surface, the second conductive layer covers the opening of the through hole on the second surface of the insulating base material and extends radially outward from the edge portion of the opening by 20 μm or more.

2. The interconnected electrode structure according to claim 1, wherein a protrusion height of a highest point of the second conductive layer relative to the third conductive layer is less than 5 μm.

3. The interconnected electrode structure according to claim 1, wherein an area of the opening of the through hole on the first surface or the second surface of the insulating base material is smaller than 0.13 mm$^2$; and/or, a perimeter of the opening of the through hole on the first surface or the second surface of the insulating base material is 10-800 μm; and/or, a protrusion height of an edge portion of the opening of the through hole on the first surface or the second surface of the insulating base material relative to the first surface or the second surface is less than 5 μm;
and/or, a conductive structure formed by conductive slurry is arranged on the first surface of the insulating base material, and the conductive structure and the first conductive body are integrally formed;
and/or, the insulating base material comprises a transparent insulating film; and/or, a thickness of the insulating base material is 1-300 μm.

4. A device, comprising a functional module and an electrode module that cooperates with the functional module, wherein the electrode module comprises the interconnected electrode structure according to claim 1.

5. A method of manufacturing an interconnected electrode structure, the interconnected electrode structure comprising:
an insulating base material, comprising a first surface and a second surface which face away from each other;
a through hole, penetrating through the insulating base material in a thickness direction;
a first conductive body, formed by conductive slurry that enters the through hole from an opening of the through hole on the first surface, wherein a bottom end of the first conductive body reaches any set position between two ends of the through hole; and
a second conductive body, formed by a second conductive material that enters the through hole from an opening of the through hole on the second surface, and also electrically combined with the first conductive body to form a conductive channel in the insulating base material, wherein the method comprises:
machining a selected region of an insulating base material to form the through hole, wherein the through hole penetrates through the insulating base material in the thickness direction;
applying a conductive slurry containing a first conductive material to a first surface of the insulating base material, and allowing part of the conductive slurry to enter the through hole and reach a set position, wherein a selected position is located between two ends of the through hole; and
forming, from the second conductive material, a second conductive layer on the second surface of the insulating base material facing away from the first surface, and allowing part of the second conductive material to enter the through hole to form the second conductive body, wherein the second conductive body is electrically combined with the first conductive body in the through hole, and the first conductive body is formed by the conductive slurry entering the through hole, so that the conductive channel is formed in the insulating base material.

6. The method according to claim 5, further comprising: forming a third conductive layer on the second surface of the insulating base material, wherein the third conductive layer is a transparent conductive layer.

7. The method according to claim 6, specifically comprising: first forming the conductive channel in the insulating base material, then forming the third conductive layer on the second surface of the insulating base material, and allowing the third conductive layer to be in electrical contact with the second conductive layer; or, first forming the third conductive layer on the second surface of the insulating base material, then machining the selected region of the insulating base material to form the through holes, forming the conductive channel in the insulating base material, and allowing the second conductive layer to be in electrical contact with the third conductive layer.

8. The method according to claim 5, wherein the second conductive layer is distributed at least on one side of the third conductive layer; and/or, the second conductive layer and the third conductive layer overlap at least partially;

and/or, the second conductive layer is arranged around the third conductive layer in a semi-enclosed form, or the second conductive layer is arranged around the third conductive layer.

9. The method according to claim 8, wherein the second conductive layer is linear and has a line width of less than or equal to 5 mm, preferably less than or equal to 1 mm; and/or, a protrusion height of a highest point of the second conductive layer relative to the third conductive layer is less than 5 μm, preferably less than 1 μm;

and/or, an equivalent square resistance of the second conductive layer is less than or equal to 5 Ω/sq, preferably less than or equal to 1 Ω/sq.

10. The method according to claim 5, wherein a manner of forming the second conductive layer on the second surface of the insulating base material using the second conductive material comprises a physical and/or chemical deposition manner, preferably comprising any one or a combination of more of printing, coating, adhesive dispensing, vacuum evaporation, or magnetron sputtering.

11. The method according to claim 10, comprising: forming the second conductive layer by using any one of inkjet printing, air jet printing, intaglio printing, screen printing, flexographic printing, and mask spraying.

12. The method according to claim 5, wherein the insulating base material comprises a transparent insulating film, and preferably, a material of the transparent insulating film comprises any one or a combination of more of glass, polyester, polyurethane, and polyimide; and/or, a thickness of the insulating base material is 1-300 μm, preferably 15-150 μm;

and/or, a material of a transparent conductive layer comprises any one of or a combination of more of a metal oxide, a metal, a conductive polymer, and a carbon material;

and/or, a viscosity of the conductive slurry is 20-100,000 cP, preferably 100-10,000 cP; and/or, a surface tension of a main solvent component in the conductive slurry is 15-72 dyn/cm, preferably 27-50 dyn/cm; and/or, applying the conductive slurry to the first surface of the insulating base material comprises any one or a combination of more of printing, coating, or adhesive dispensing.

13. The method according to claim 5, wherein an opening area of the through hole on the first surface or the second surface of the insulating base material is smaller than 0.13 $mm^2$, preferably smaller than 0.03 $mm^2$; and/or, a perimeter of the opening of the through hole on the first surface or the second surface of the insulating base material is 10-800 μm, preferably 60-400 μm; and/or, a protrusion height of an edge portion of the opening of the through hole on the first surface or the second surface of the insulating base material relative to the first surface or the second surface is less than 5 μm, preferably less than 1 μm; a thickness of the second conductive layer is greater than a protrusion height of an edge portion of the opening of the through hole on the second surface of the insulating base material relative to the second surface; and/or, the second conductive layer covers the opening of the through hole on the second surface of the insulating base material and extends radially outward from the edge portion of the opening by 20 μm or more, preferably 50 μm or more.

* * * * *